（12）United States Patent
Chuang et al.

(10) Patent No.: US 11,798,885 B2
(45) Date of Patent: Oct. 24, 2023

(54) METHOD OF FABRICATING COPPER PILLAR BUMP STRUCTURE WITH SOLDER SUPPORTING BARRIER

(71) Applicant: Changxin Memory Technologies, Inc., Anhui (CN)

(72) Inventors: Ling-Yi Chuang, Hefei (CN); Dingyou Lin, Hefei (CN)

(73) Assignee: Changxin Memory Technologies, Inc., Hefei (CN)

( * ) Notice: Subject to any disclaimer, the term of this patent is extended or adjusted under 35 U.S.C. 154(b) by 63 days.

(21) Appl. No.: 17/217,269

(22) Filed: Mar. 30, 2021

(65) Prior Publication Data

US 2021/0217703 A1    Jul. 15, 2021

Related U.S. Application Data

(63) Continuation of application No. PCT/CN2019/116787, filed on Nov. 8, 2019.

(30) Foreign Application Priority Data

Nov. 20, 2018  (CN) .......................... 201811385499.7
Nov. 20, 2018  (CN) .......................... 201821951664.6

(51) Int. Cl.
  *H01L 21/768*   (2006.01)
  *H01L 23/522*   (2006.01)
  (Continued)

(52) U.S. Cl.
  CPC .... *H01L 23/53238* (2013.01); *H01L 21/4846* (2013.01); *H01L 21/76885* (2013.01);
  (Continued)

(58) Field of Classification Search
  CPC .......... H01L 23/53238; H01L 21/4846; H01L 21/76885; H01L 24/11; H01L 24/14;
  (Continued)

(56) References Cited

U.S. PATENT DOCUMENTS

2009/0098723 A1*  4/2009  Yu ........................... H01L 24/12
                                                       257/E21.476
2010/0270067 A1*  10/2010  Choi .................... H05K 3/3485
                                                       29/846

(Continued)

FOREIGN PATENT DOCUMENTS

CN      105374775 A      3/2016
CN      106486444 A      3/2017
CN      209119091 U      7/2019

OTHER PUBLICATIONS

PCT International Search Report and the Written Opinion dated Feb. 7, 2020, issued in related International Application No. PCT/CN2019/116787 (8 pages).

*Primary Examiner* — Marcos D. Pizarro
*Assistant Examiner* — Tenley H Schofield
(74) *Attorney, Agent, or Firm* — Sheppard Mullin Richter & Hampton LLP

(57) ABSTRACT

A copper pillar bump structure on a copper pillar on a metal pad of a semiconductor device and a method of fabricating thereof are disclosed. The copper pillar bump structure includes: a metal barrier layer formed on the copper pillar. The metal barrier layer has a U-shaped cross section, a central portion of the metal barrier layer covers the top surface of the copper pillar, an opening of the U-shaped cross section faces away from the copper pillar. The copper pillar bump structure further includes a solder layer on the copper pillar and filling the U-shaped cross section. The copper pillar bump structure provides a metal barrier layer having a U-shaped cross section and fills a solder layer in the U-shaped cross section, the metal barrier layer wraps sides of the solder layer, which can improve the non-wetting problem caused by insufficient tin, or the solder bridging problem caused by excessive solder, during a flip die soldering process.

3 Claims, 10 Drawing Sheets

(51) Int. Cl.
  *H01L 23/00* (2006.01)
  *H01L 23/31* (2006.01)
  *H01L 23/495* (2006.01)
  *H01L 23/528* (2006.01)
  *H01L 23/532* (2006.01)
  *H01L 21/48* (2006.01)
(52) U.S. Cl.
  CPC .............. *H01L 24/11* (2013.01); *H01L 24/14* (2013.01); *H01L 2224/13147* (2013.01)
(58) Field of Classification Search
  CPC ........... H01L 2224/13147; H01L 24/13; H01L 23/485; H01L 21/441; H01L 21/4853; H01L 24/03; H01L 24/05; H01L 2224/0346; H01L 2224/1147; H01L 2224/13082; H01L 2224/11849
  See application file for complete search history.

(56) References Cited

U.S. PATENT DOCUMENTS

| | | | |
|---|---|---|---|
| 2011/0057307 A1* | 3/2011 | Topacio | ............ H01L 23/49811 257/737 |
| 2013/0292827 A1 | 11/2013 | Kuo et al. | |
| 2013/0313707 A1* | 11/2013 | Choi | ....................... H01L 24/05 257/738 |
| 2015/0262953 A1* | 9/2015 | Lee | ........................ H01L 24/13 257/737 |

* cited by examiner

METHOD OF FABRICATING COPPER PILLAR BUMP STRUCTURE WITH SOLDER SUPPORTING BARRIER

CROSS-REFERENCE TO RELATED APPLICATIONS

This application is a continuation application of International Patent Application No. PCT/CN2019/116787, filed on Nov. 8, 2019, which is based on and claims priority of the Chinese Patent Application Nos. 201811385499.7 and 201821951664.6, both filed on Nov. 20, 2018. The above-referenced applications are incorporated herein by reference in its entirety.

TECHNICAL FIELD

This present invention relates generally to the field of semiconductor manufacturing technology and more specifically, but not by way of limitation, to a copper pillar bump structure and a method of fabricating the same.

BACKGROUND

With the development electronic technologies, integrated circuits are becoming more powerful and integrated, and new types of integrated circuits keep emerging. As a result, packaging technology is playing an increasingly important role in integrated circuit products, and becoming an increasingly larger proportion of the value of the entire electronic system. Meanwhile, with the feature size of integrated circuits approaching the nanometer level, transistors are disposed more densely in the integrated circuits, and each having a higher clock frequency. Correspondingly, packaging needs to be conducted at a higher density. As package densities continue to increase, the electrical interconnection on narrow pitch between neighboring dies or between a die and a package substrate may become unreliable. Conventional lead-free solder bump technology can no longer provide reliable narrow-pitch interconnects as feature size continuously decreases. Copper pillar bump interconnect technology, with its superior electrical performance and anti-electromigration capability, is becoming a key technology for the next-generation narrow-pitch interconnection.

The microelectronic package provides an electrical connection to the circuit substrate for the semiconductor die while protecting the fragile and sensitive die, thereby facilitating the testing, rework, and standardization of input and output ports, and compensating for the thermal mismatch between the semiconductor die and the circuit substrate. In order to comply with the continuous development of silicon-based semiconductor die technology and the environmental regulation for microelectronic packaging, the microelectronic package interconnection technology is rapidly evolving in term of its structure and material. For example, the technology has evolved from wire bonding to flip die interconnection, from tin-lead/high-lead solder bump interconnects to lead-free solder bump interconnects, from solder bump interconnects to copper pillar bump interconnects.

As a next-generation die package interconnect technology, copper pillar bump interconnects are increasingly being adopted by more and more die packages.

In conventional technology, during the flip die soldering process, insufficient solder material, which may be caused by climbing tin, may lead to a non-wetting problem, while excessive solder material may cause solder bridging between the bumps.

In view of the above description, how to avoid defective bump bonding due to excessive or insufficient solder material during the flip die soldering process is an urgent problem to be solved.

It is to be noted that the information disclosed in this Background section is only for facilitating the understanding of the background of the invention and therefore may contain information that does not form the prior art that is known to a person of ordinary skill in the art.

SUMMARY

In view of the limitations of existing technologies described above, the present invention provides a copper pillar bump structure and a method of fabricating the same, which overcomes the problem of defective bump bonding due to excessive or insufficient soldering material in flip die bonding.

Other features and advantages of the present invention will be apparent from the description and appended claims.

A first aspect of the present invention is directed to a copper pillar bump structure on a copper pillar on a metal pad of a semiconductor device, the copper pillar having a top surface and a side surface. The copper pillar bump structure may include a metal barrier layer formed on the copper pillar, the metal barrier layer having a U-shaped cross section, a central portion of the metal barrier layer covering the top surface of the copper pillar, an opening of the U-shaped cross section facing away from the copper pillar; a solder layer formed on the copper pillar and filling the U-shaped cross section, and having a solder bump on a surface of the metal barrier layer. A peripheral portion of the metal barrier layer at a side of the U-shaped cross section may be bent to form a wall extending from the central portion of the metal barrier layer and away from the copper pillar to protrude from the top surface, for preventing the solder layer from diffusing to the copper pillar.

In some embodiments, the aforementioned structure may further include a beneath-bump metal layer arranged between the copper pillar and the metal pad.

In some embodiments, the aforementioned structure may further include a passivation layer having a first opening formed on the semiconductor device. The passivation layer may cover a peripheral edge of the metal pad. The first opening may be aligned with the metal pad and may have a size smaller than the metal pad.

In some embodiments, the copper pillar may have a T-shaped cross section, and the copper pillar bump structure may further include a surface protection layer. The surface protection layer may be formed on the passivation layer and covering a portion of an upper surface of the metal pad, the surface protection layer may have a second opening, with a T-shaped bottom of the copper pillar filling the second opening. The second opening may be aligned with the first opening and may have a size smaller than the first opening.

In some embodiments, a portion of the beneath-bump metal layer may be arranged between the copper pillar and the surface protection layer.

In some embodiments, the wall may have a circular cross section, and may extend along a circumference of the top surface of the copper pillar while not exceeding a surrounding area of the side surface of the copper pillar.

A second aspect of the present invention is directed to a fabricating method of a copper pillar bump structure. The method may include: providing a semiconductor device having a metal pad; forming a copper pillar on the metal pad, the copper pillar having a top surface and a side surface;

forming a metal barrier layer on the copper pillar, the metal barrier layer having a U-shaped cross section, a central portion of the metal barrier layer covering the top surface of the copper pillar, an opening of the U-shaped cross section facing away from the copper pillar, wherein a peripheral portion of the metal barrier layer at a side of the U-shaped cross section may be bent to form a wall extending from the central portion of the metal barrier layer and away from the copper pillar to protrude from the top surface; forming a solder layer by filling the U-shaped cross section with a solder material, and forming a solder bump on a surface of the metal barrier layer by a high temperature reflow process. The wall may be used to prevent the solder layer from diffusing to the copper pillar.

In some embodiments, the aforementioned method may further include: before forming a copper pillar on the metal pad, forming a passivation layer having a first opening on the semiconductor device. The passivation layer may cover a peripheral edge of the metal pad. The first opening may be aligned with the metal pad and may have a size smaller than the metal pad.

In some embodiments, the aforementioned method may further include: after forming a passivation layer on the semiconductor device, forming a surface protection layer on the passivation layer and on an upper surface of the metal pad; forming a second opening having a size smaller than the first opening on the surface protection layer at a position for the copper pillar by a photolithography process.

In some embodiments, the aforementioned method may further include: before forming a copper pillar on the metal pad, depositing a metallic material on the semiconductor device to form a beneath-bump metal layer.

In some embodiments, the aforementioned method may further include: before forming a copper pillar on the metal pad, forming a first photoresist layer covering the semiconductor device except for a position corresponding to the copper pillar. The aforementioned method may further include: after forming a copper pillar on the metal pad, removing the first photoresist layer.

In some embodiments, the aforementioned method may further include: before forming a metal barrier layer on the copper pillar, forming a mask layer on the semiconductor device having the copper pillar formed thereon; and forming a third opening on the mask layer at a position for the copper pillar by a photolithography process.

In some embodiments, the aforementioned method may further include: after forming a copper pillar on the metal pad, forming a metal barrier layer by electroplating a metallic material on the semiconductor device having the mask layer formed thereon; forming a second photoresist layer on the metal barrier layer at a position corresponding to the copper pillar; etching a portion of the metal barrier layer not covered by the second photoresist layer; removing the second photoresist layer; filling the U-shaped cross section with a solder material to form a solder layer; and removing the mask layer.

In some embodiments, the aforementioned method may further include: after forming a copper pillar on the metal pad, forming a metal barrier layer by electroplating a metallic material on the semiconductor device having the mask layer formed thereon; forming a third photoresist layer covering the metal barrier layer except for a position corresponding to the copper pillar; filling the U-shaped cross section with a solder material to form a solder layer; removing the third photoresist layer; etching a portion of the metal barrier layer not covered by the solder layer; and removing the mask layer.

The technical solutions provided by the embodiments of the present invention may include the following beneficial effects.

In an exemplary embodiment of the present invention, by providing a metal barrier layer having a U-shaped cross section and filling a solder layer in the U-shaped cross section, the metal barrier layer may wrap the solder layer. As a result, the non-wetting problem caused by insufficient solder material as a result of climbing tin, or the solder bridging problem caused by excessive solder material, during a flip die soldering process may be remedied.

It is to be understood that both the foregoing general description and the following detailed description are exemplary and explanatory only and are not restrictive of this present invention.

BRIEF DESCRIPTION OF THE DRAWINGS

The accompanying drawings, which are incorporated in and constitute a part of the description, illustrate embodiments consistent with the present disclosure and, together with the description, serve to explain the disclosed principles. It is apparent that these drawings show only some embodiments of the disclosure and those of ordinary skill in the art may obtain drawings of other embodiments from them without exerting any creative work.

DETAIL DESCRIPTION OF THE EMBODIMENTS

Exemplary embodiments will now be described more fully with reference to the accompanying drawings. However, these exemplary embodiments can be implemented in many forms and should not be construed as being limited to those set forth herein. Rather, these embodiments are presented to provide a full and thorough understanding of the present invention and to fully convey the concepts of the exemplary embodiments to others skilled in the art.

Throughout the drawings, like reference numbers indicate identical or similar elements, so any duplicate description of them will be omitted.

Although the relative terms such as "upper" and "lower" are used in the specification to describe the relative relationship of one component of the icon to another component, these terms are used in this specification for convenience only, for example, according to direction of the accompanying drawings. It can be understood that if the module of the icon is flipped upside down, the component described as "upper" will become the component "lower". Other relative terms, such as "upper", "lower", "top", "bottom", "left", "right", etc., also have similar meanings.

When a structure is "on" another structure, it may mean that a structure is integrally formed on another structure, or that a structure is "directly" disposed on another structure, or that a structure is "indirectly" disposed through other structures.

The terms "a", "an" and "the" are used to mean the presence of one or more elements/components, etc.; the terms "including" and "having" are used to mean the inclusion of an open type and means that there may be additional elements/components/etc. in addition to the listed elements/components/etc.

Figure 1:
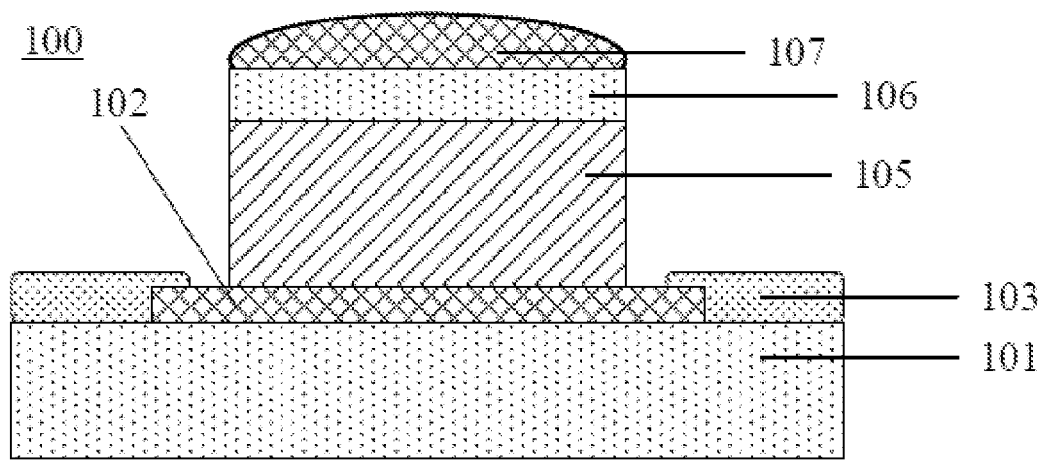
FIG. 1 is a schematic structural view showing a copper pillar bump structure.

FIG. 1 is a schematic structural view showing a copper pillar bump structure. In one embodiment of the present invention, in the copper pillar bump structure 100 shown in FIG. 1, a metal pad 102 may be formed on the semiconductor device 101, a passivation layer 103 may be formed on the metal pad 102, a copper pillar 105 may be formed on the passivation layer 103, a metal barrier layer 106 may be formed on the copper pillar 105, and a solder layer 107 may be formed on the metal barrier layer 106.

In this example, the metal barrier layer 106 may have a planar structure. Thus, during the flip die soldering process, there may be a problem of non-wetting caused by insufficient solder material, or a solder bridging problem caused by excessive solder material.

The present invention provides a copper pillar bump structure. In the copper pillar structure, the metal barrier layer may have a U-shaped cross section instead of a planar shape. The opening of the U-shaped section may face away from the copper pillar and may wrap the solder layer. The exemplary embodiments of the present invention will be described in detail below with reference to the accompanying drawings.

Figure 2:
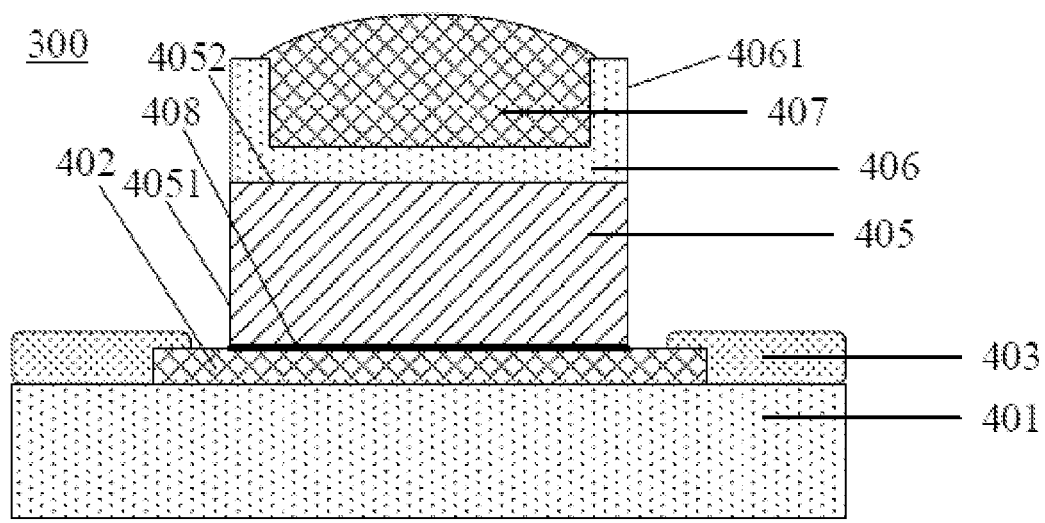
FIG. 2 is a schematic structural view showing a copper pillar bump structure in accordance with one embodiment of the present invention.

FIG. 2 is a schematic structural view showing a copper pillar bump structure in accordance with one embodiment of the present invention. Referring to FIG. 2, a copper pillar bump structure 300 provided by an embodiment of the present invention may include: a semiconductor device 401 having a metal pad 402; a copper pillar 405 disposed on the metal pad 402, with the copper pillar 405 having a top surface 4052 and a side surface 4051; a metal barrier layer 406 on the copper pillar 405, with the metal barrier layer 406 having a U-shaped cross section, and a central portion of the metal barrier layer covering the top surface of the copper pillar, the opening of the U-shaped section facing away from the copper pillar 405; the solder layer 407 formed on the copper pillar 405 and filling the U-shaped cross section, and having a solder bump on a surface of the metal barrier layer 406. The metal barrier layer 406 may be bent at a peripheral portion of a side of the U-shaped cross section to form a wall 4061, for preventing the solder layer 407 from diffusing to the side of the copper pillar.

In this solution, the solder layer 407 may fill the U-shaped cross section. Since the solder layer 407 is wrapped by the U-shaped cross section, the non-wetting problem caused by the insufficient solder material or the solder bridging problem caused by excessive solder material during the soldering process may be remedied.

The semiconductor device 401 may include a semiconductor substrate, a plurality of IC lines and an insulating layer. The wall 4061 may have an annular cross-section and may surround the circumference of the top surface of the copper pillar, while not extending beyond the side of the copper pillar such that the bottom of the wall 4061 is disposed on the copper pillar 405. According to an exemplary embodiment of the present invention, the metal pad 402 may be made of aluminum or copper, and is not limited thereto.

According to an exemplary embodiment of the present invention, the copper pillar bump structure 300 may further include a passivation layer 403 having a first opening formed on the semiconductor device 401. The passivation layer 403 may cover a peripheral edge of the metal pad 402, and the first opening may be aligned with the metal pad 402 and have a size smaller than the metal pad 402.

The passivation layer may be made of one or a combination of silicon dioxide and silicon nitride.

The copper pillar 405 in the copper pillar bump structure 300 may have a rectangular cross-section for providing a substantial height of the bond bumps. The copper pillar 405 may occupy at least 40% of the overall height of the copper pillar bump structure 300 measured from the metal pad 402. A beneath-bump metal layer 408 may be disposed between the metal pad 402 and the copper pillar 405. In one example, the size of the beneath-bump metal layer 408 may correspond to the surface coverage area of the copper pillar 405. The copper pillar 405 and the beneath-bump metal layer 408 may partially expose the peripheral portion of the metal pad 402, doing so may remedy the problem of insufficient wetting of the top surface of the copper pillar 405 or improper wetting of a side surface of the copper pillar 405 caused by insufficient solder material.

The beneath-bump metal layer 408 may include metallic material layers such as a Ti layer and a Cu layer. The metallic material layers (e.g., a Ti layer and a Cu layer) of the beneath-bump metal layer 408 may be formed on a surface protection layer 404 and the metal pad 402 by physical vapor deposition. The Ti layer can be used to adhere and may prevent the metal copper from entering into the semiconductor device 401. The Cu layer can be used as an electrode for plating. The beneath-bump metal layer 408 may be electrically connected to the metal pad 402.

In some embodiments of the present invention, the metal barrier layer 406 may be made of nickel. The metal barrier layer 406 may have a bowl shape. For example, the metal barrier layer 406 may have a structure in which a peripheral portion is a wall section and a bottom portion is circular, thus forming an accommodating cavity having an opening. The accommodating cavity may have the U-shaped cross section described above.

The solder layer 407 may be made of one of lead, tin, and silver or an alloy containing any of the above solder metals. For example, the material of the solder layer may specifically be a tin-silver alloy containing a tin content of 98.2% to 98.5% and a silver content of 1.5% to 1.8%.

Figure 3:
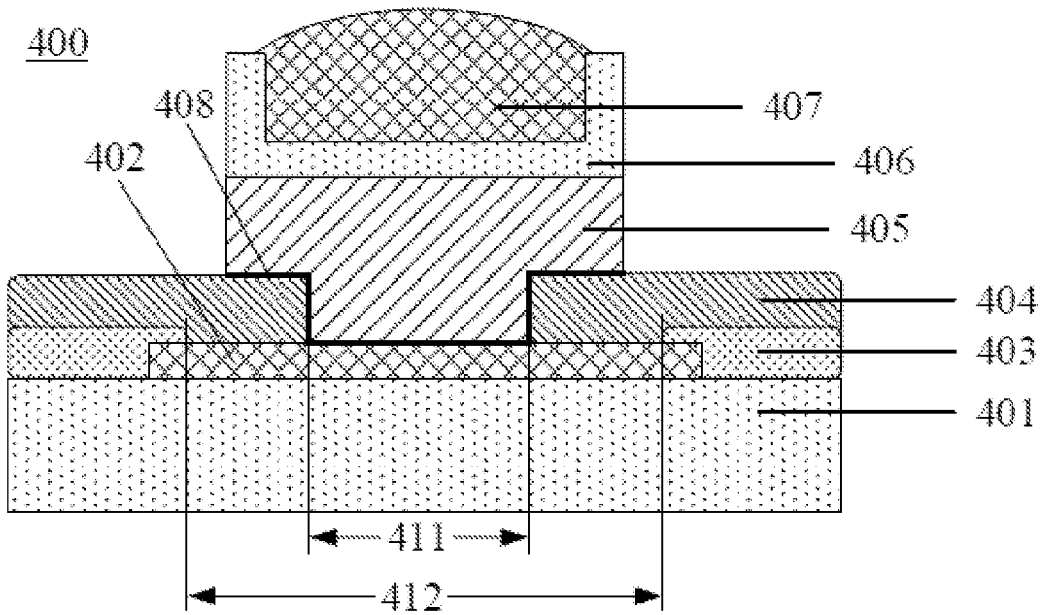
FIG. 3 is a schematic structural view showing a copper pillar bump structure in accordance with another embodiment of the present invention.

According to another exemplary embodiment of the present invention, referring to FIG. 3, the passivation layer 403 may cover a peripheral edge of the metal pad 402 and have a first opening 412. The first opening 412 may be aligned with the metal pad 402 and have a size smaller than the metal pad 402. The copper pillar bump structure 400 is different from the copper pillar bump structure 300 in that the copper pillar bump structure 400 may further include a surface protection layer 404. The surface protection layer 404 may be made of polyimide. The copper pillar 405 may have a T-shaped cross section. The surface protection layer 404 may be formed on the passivation layer 403 and may partially cover the upper surface of the metal pad 402, and have a second opening 411. The second opening 411 may be aligned with the first opening 412 and have a size smaller than the first opening 412. The T-shaped bottom of the copper pillar 405 may fill the second opening 411. The surface protection layer 404 may cover the upper surfaces of the passivation layer 403 and the metal pad 402, and the lower portion of the copper pillar 405 may fill the second opening 411 of the surface protection layer 404.

Referring to FIG. 3, the copper pillar bump structure 400 may have a beneath-bump metal layer 408 disposed between the metal pad 402 and the copper pillar 405. The central portion of the beneath-bump metal layer 408 may be located between the copper pillar 405 and the metal pad 402. The peripheral portion of the beneath-bump meta layer 408 may be located between the copper pillar 405 and the surface protection layer 404 such that the copper pillar 405 is not in direct contact with the metal pad 402.

In the copper pillar bump structure provided by the exemplary embodiment of the present invention, by providing a metal barrier layer having a U-shaped cross section and filling the U-shaped cross section with a solder layer, the metal barrier layer wraps the solder layer. As a result, the non-wetting problem caused by insufficient solder material, or the solder bridging problem caused by excessive solder material, during a flip die soldering process may be remedied.

Figure 4:
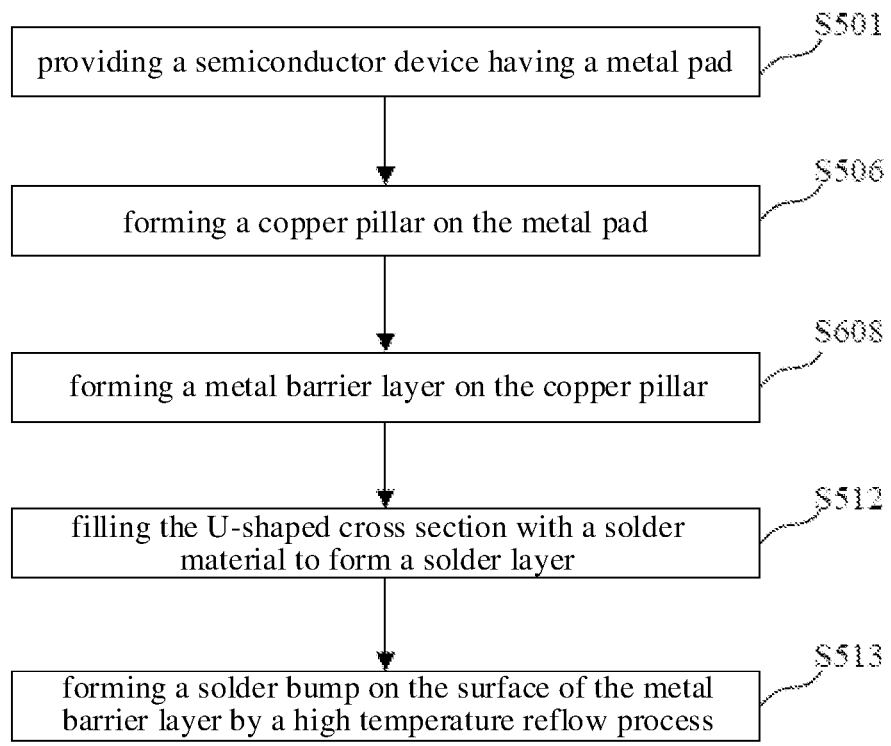
FIG. 4 is a flow chart illustrating a method of fabricating a copper pillar bump structure in accordance with one embodiment of the present invention.

FIG. 4 is a flow chart illustrating a method of fabricating a copper pillar bump structure in accordance with one embodiment of the present invention. As shown in FIG. 4, a method for fabricating a copper pillar bump structure provided by an exemplary embodiment of the present invention may include the following steps.

In step S501, a semiconductor device having a metal pad may be provided.

In step S506, a copper pillar may be formed on the metal pad. The copper pillar may have a top surface and a side surface.

In step S608, a metal barrier layer may be formed on the copper pillar. The metal barrier layer may have a U-shaped cross section, a central portion of the metal barrier layer may cover the top surface of the copper pillar, an opening of the U-shaped section may face away from the copper pillar. A peripheral portion of the metal barrier layer at a side of the U-shaped cross section may be bent to form a wall extending from the central portion of the metal barrier layer and may extend in a direction away from the copper pillar to protrude from the top surface.

In step S512, the U-shaped cross section may be filled with a solder material to form a solder layer.

In step S513, a solder bump may be formed on the surface of the metal barrier layer by a high temperature reflow process. The metal barrier layer may be bent at a peripheral portion of the U-shaped cross section to form a wall for preventing the solder layer from diffusing to the side of the copper pillar.

In this solution, the metal barrier layer may have a U-shaped cross section, and the U-shaped cross-section is filled with a solder material, so that the U-shaped cross section wraps the solder layer. As a result, the non-wetting problem caused by insufficient solder material or the solder bridging problem caused by excessive solder material during the flip die soldering process may be remedied.

In an exemplary embodiment of the present invention, the semiconductor device may include a silicon substrate. The metal pad may be made of aluminum or copper.

Figure 5:
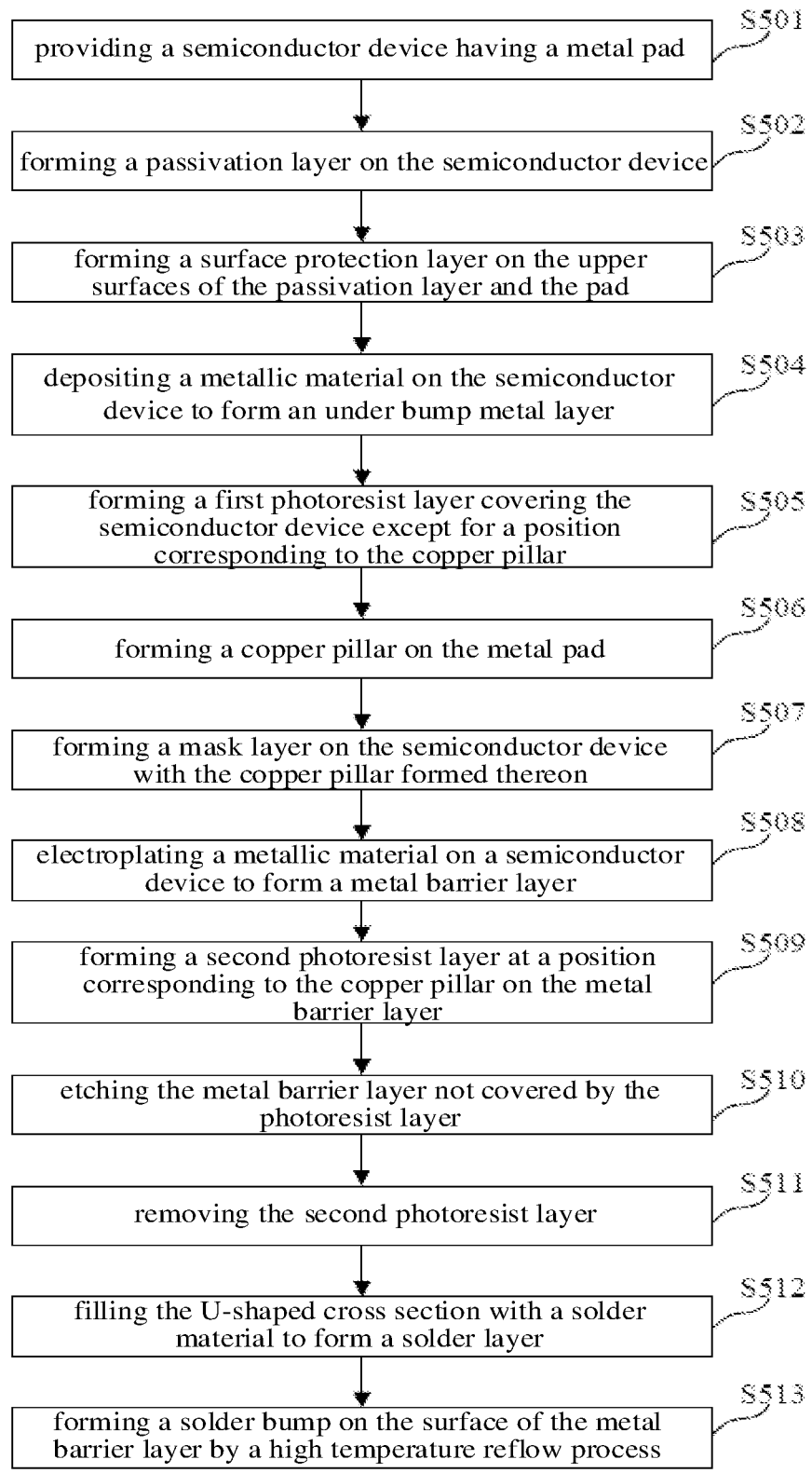
FIG. 5 is a flow chart illustrating a method of fabricating a copper pillar bump structure in accordance with another embodiment of the present invention.
Figure 7:
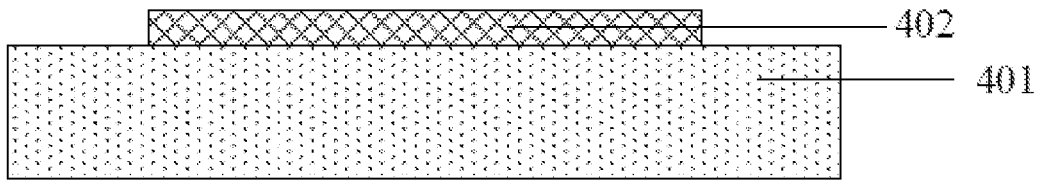
FIGS. 7, 8, 9, 10, 11, 12, 13, 14, 15, 16, 17, and 18 are schematic cross-sectional views of steps S501 to S512 in accordance with one or more embodiments of the present invention.

FIG. 5 is a flow chart illustrating a method of fabricating a copper pillar bump structure in accordance with another embodiment of the present invention. In an exemplary embodiment of the present invention, as shown in FIG. 5, the method may include: after step S501 (i.e., after a metal pad 402 has been formed on a semiconductor device 401, corresponding to a schematic cross-sectional view shown in FIG. 7), performing steps S502, S503, and S504.

Figure 8:
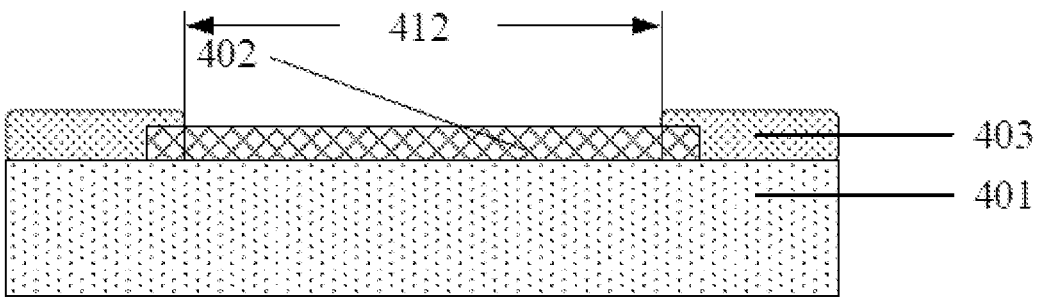

Specifically, in step S502, a passivation layer 403 may be formed on the semiconductor device 401. The passivation layer 403 may cover a peripheral edge of the metal pad 402 and may have a first opening 412. The first opening 412 may be aligned with the metal pad 402 and may have a size smaller than the metal pad 402. The passivation layer 403 may be made of one or a combination of silicon dioxide and silicon nitride. A schematic cross-sectional view of step S502 is shown in FIG. 8.

Figure 9:
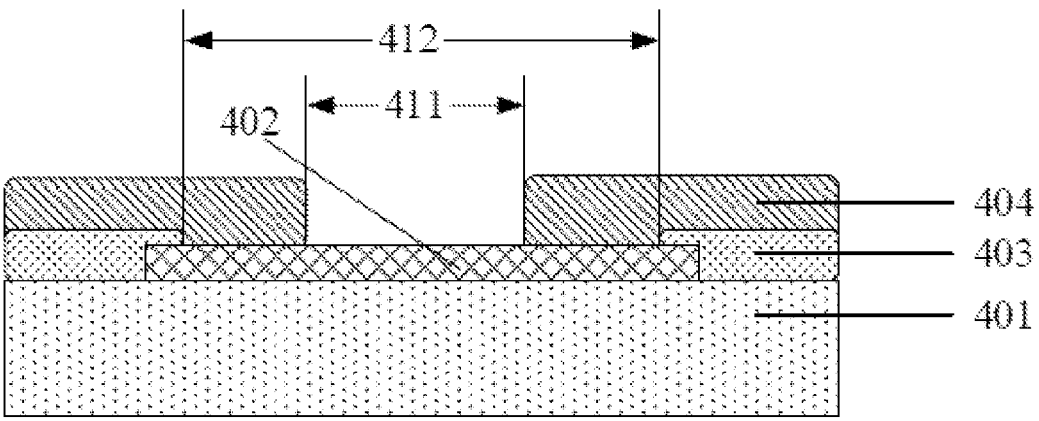

In step S503, a surface protection layer 404 may be formed on upper surfaces of the passivation layer 403 and the metal pad 402 by a deposition process. A second opening 411 for a copper pillar may be formed in the surface protective layer 404 by a photolithography process. The second opening 411 may have a size smaller than the first opening 412. The surface protection layer 404 may be made of polyimide. A schematic cross-sectional view of step S503 is shown in FIG. 9.

Figure 10:
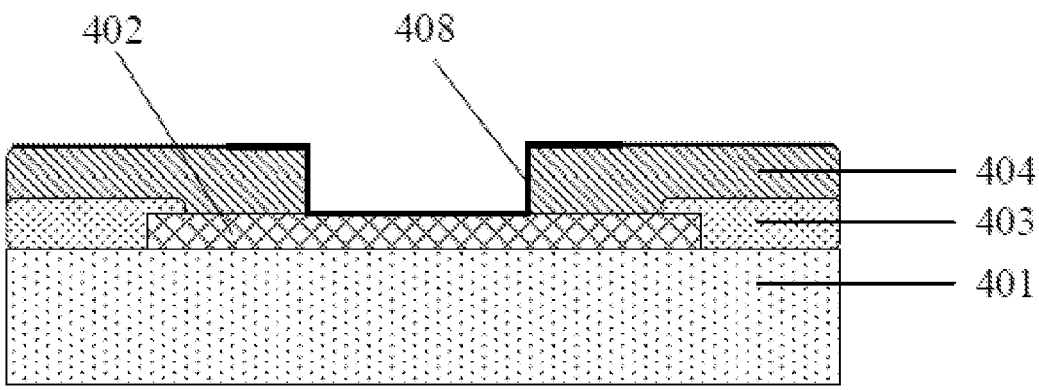

In step S504, a metallic material may be deposited on the semiconductor device 401 to form a beneath-bump metal layer 408. A schematic cross-sectional view of step S504 is shown in FIG. 10. As shown in FIG. 10, the beneath-bump metal layer 408 may overlie the metal pad 402 and the surface protection layer 404.

The beneath-bump metal layer 408 may include metallic material layers such as a Ti layer and a Cu layer, and the beneath-bump metal layer is formed on the surface protection layer 404 and the metal pad 402 by physical vapor deposition (PVD). The Ti layer of 408 may be capable of adhering and blocking metal copper from entering into the semiconductor device 401 and the metal pad 402. The Cu layer may be used as an electrode for forming a plated copper pillar.

Figure 11:
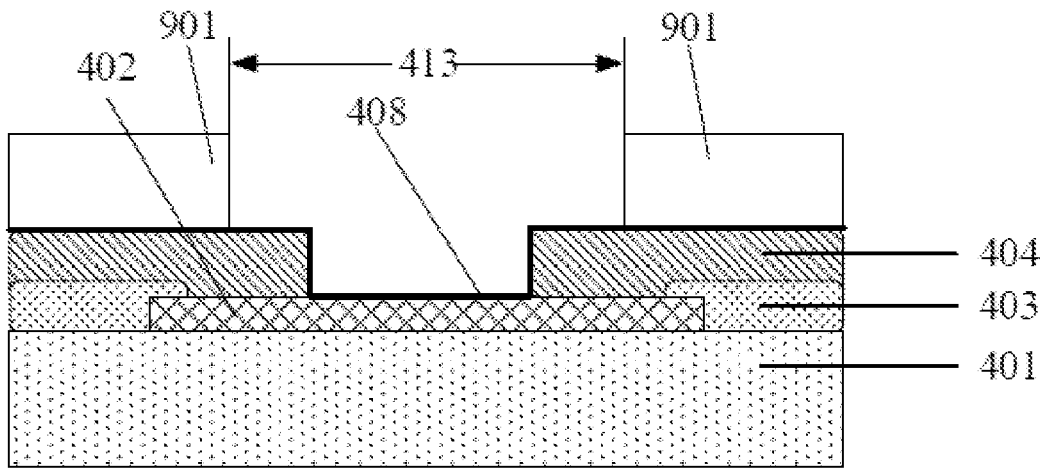

Thereafter, in step S505, a first photoresist layer 901 may be formed covering the semiconductor device 401 except for a position corresponding to the copper pillar. A schematic cross-sectional view after step S505 is completed is shown in FIG. 11.

The first photoresist layer 901 may be a photoresist layer. After the photoresist layer is formed, the photoresist layer may be exposed and developed. That is, an opening 413 for the copper pillar may be formed.

Figure 12:
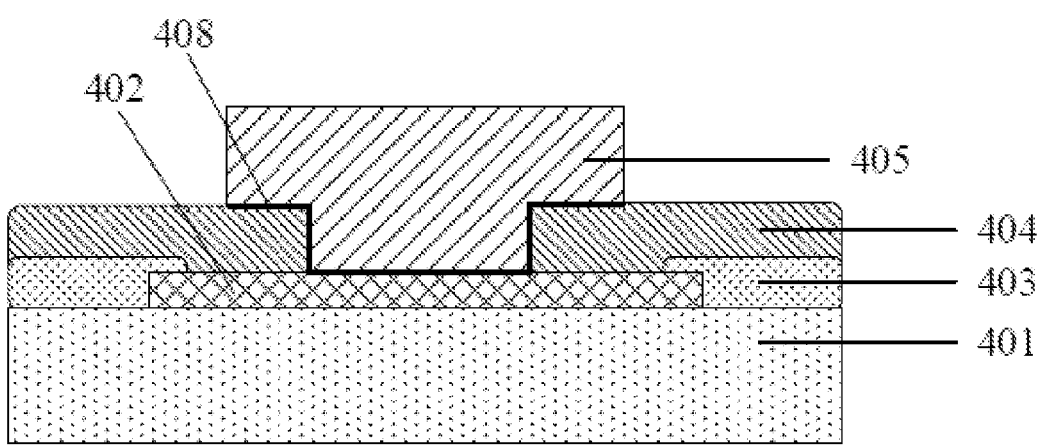

Thereafter, in step S506, a copper pillar 405 may be formed on the metal pad 402. After the step S506 is performed, the first photoresist layer 901 may be removed and the beneath-bump metal layer 408 outside the coverage area of the copper pillar 405 may be removed by etching to form a cross-sectional view as shown in FIG. 12.

In step S506, a copper pillar 405 may be formed by electroplating copper. The height of the copper pillar may be the same as the height of the photoresist layer 901. That is, the top surface of the copper pillar 405 and the top surface of the photoresist layer 901 are substantially in the same horizontal plane.

Figure 13:
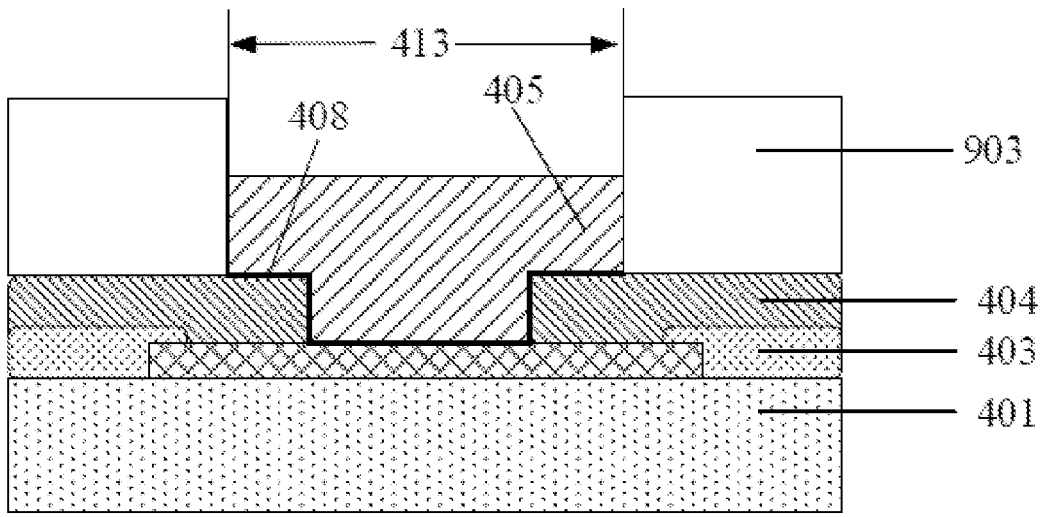

Thereafter, in step 507, a mask layer 903 or a hard mask layer may be formed on the semiconductor device with the copper pillar 405 formed thereon. A third opening 413 may be formed on the mask layer 903 at a position for the copper pillar by a photolithography process to expose the top surface of the copper pillar 405. After step 507, a schematic cross-sectional view as shown in FIG. 13 is formed. The mask layer may be a polyimide layer.

Figure 14:
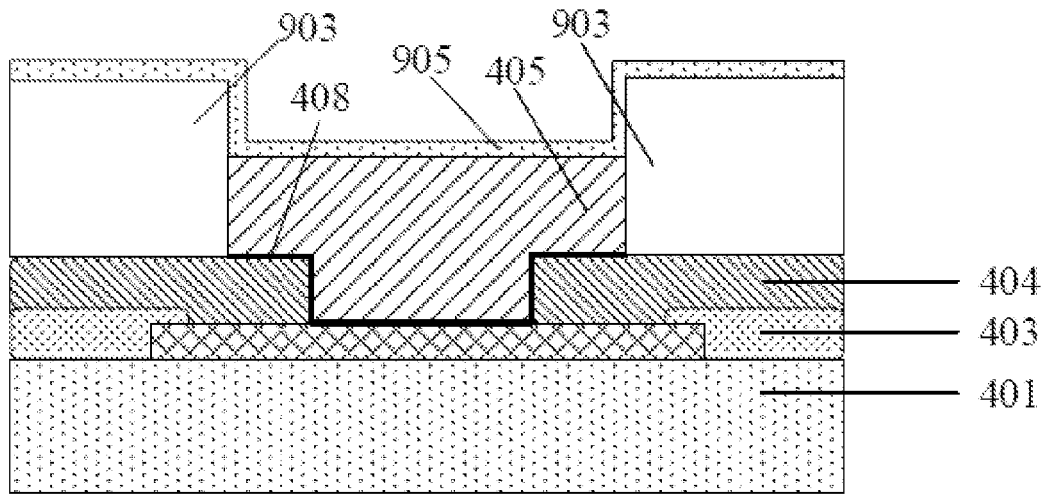

Thereafter, in step S508, a metallic material may be plated on the semiconductor device 401 having the mask layer 903 formed thereon to form a metal barrier layer 905, and a cross-sectional structure as shown in FIG. 14 is formed after step S508. The metal barrier layer may be made of nickel, but is not limited thereto. In step S508, nickel can be deposited on the semiconductor device 401 by a physical vapor deposition (PVD) technique. In the case where the metal barrier layer needs to be thickened, an electroplating process may be employed to increase the thickness of the nickel layer.

Figure 15:
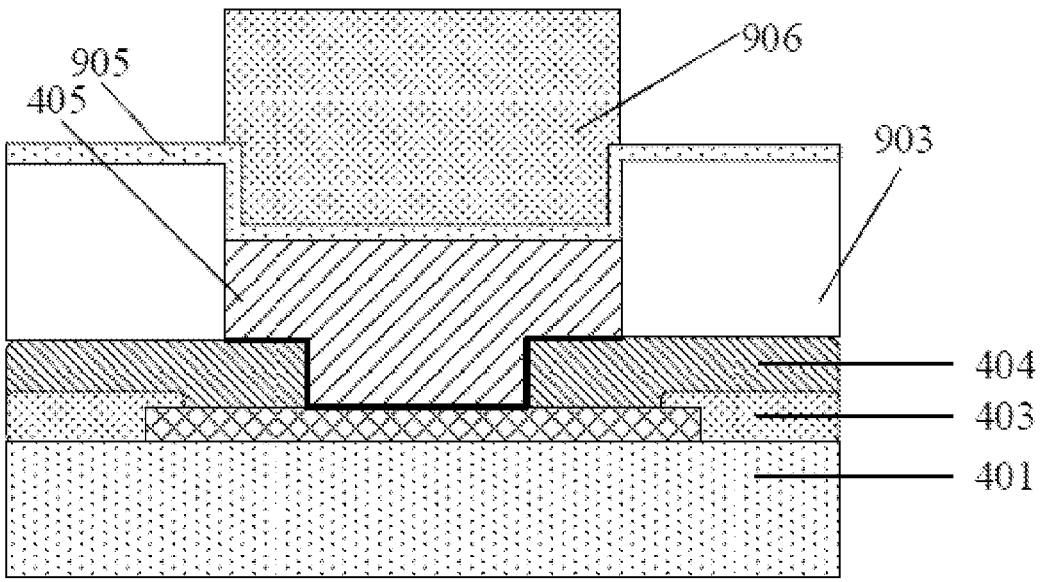

Thereafter, in step S509, a second photoresist layer 906 may be formed at a position corresponding to the copper pillar on the metal barrier layer to form a cross-sectional structure as shown in FIG. 15. The second photoresist layer 906 may cover the upper portion of the copper pillar as a mask when photolithography is performed on the metal barrier layer. Same as the first photoresist layer, the second photoresist layer 906 may also be a photoresist layer.

Figure 16:
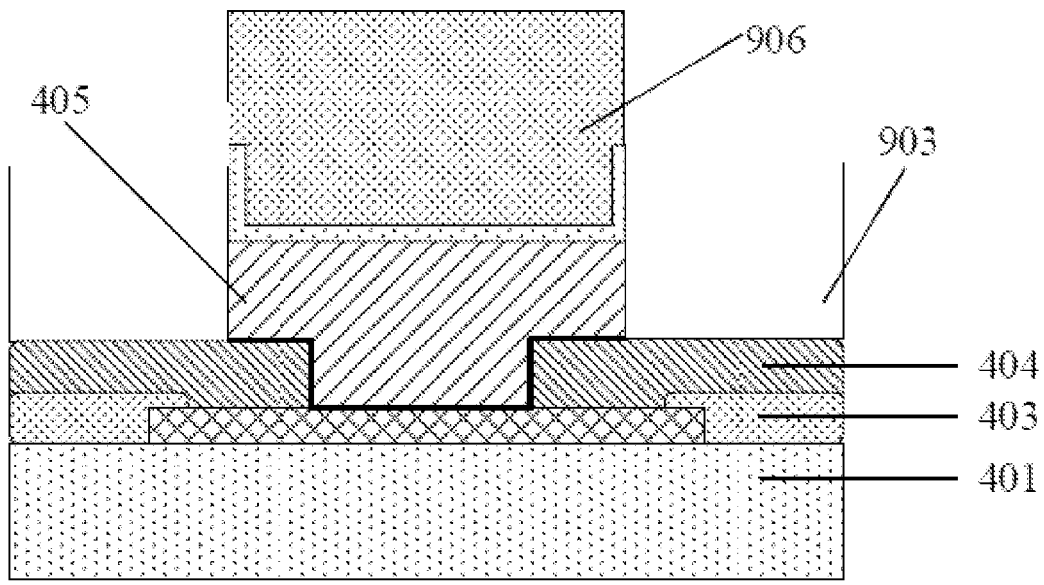

Thereafter, in step S510, the metal barrier layer not covered by the second photoresist layer may be etched to form a cross-sectional structure as shown in FIG. 16.

Figure 17:
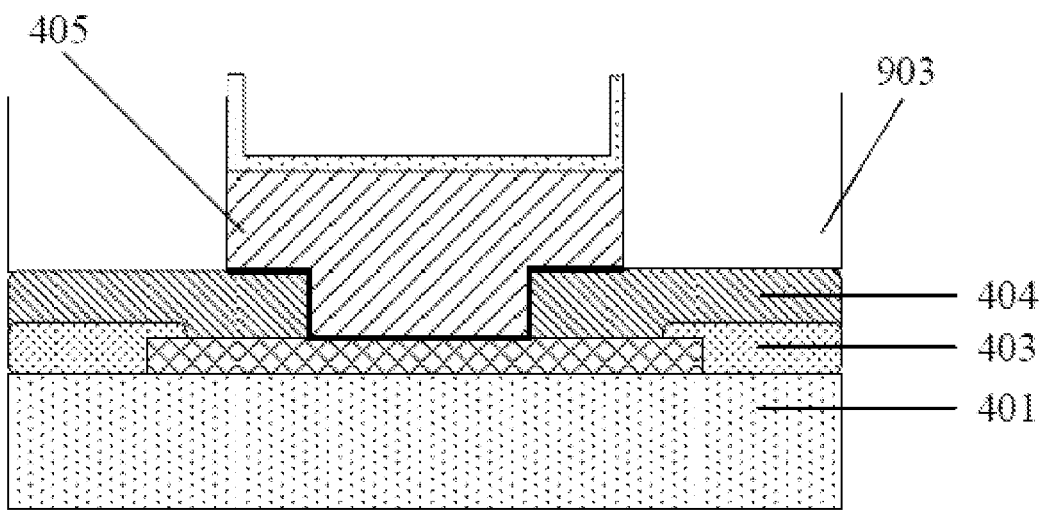

Subsequently, in step S511, the second photoresist layer may be removed to form a cross-sectional structure as shown in FIG. 17.

Figure 18:
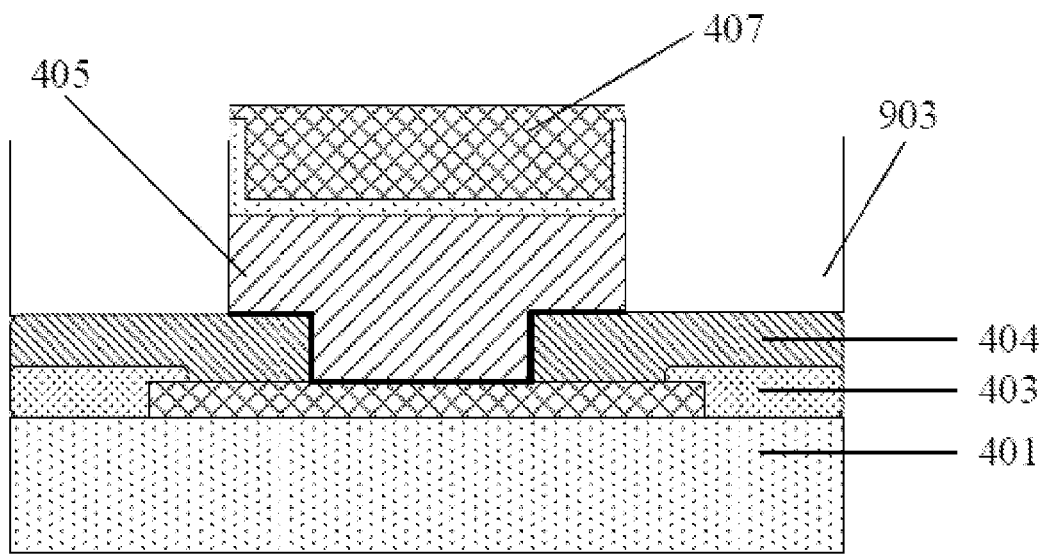

Then, in step S512, the solder layer 407 may be formed by filling a solder material in the U-shaped cross section. The height of the solder material may be slightly higher than that of the metal barrier layer to form a cross-sectional structure as shown in FIG. 18. The solder layer 407 may be made of one of lead, tin, and silver or an alloy containing any of the above solder metals. For example, the material of the solder layer may be an alloy having a tin content of 98.2% to 98.5% and a silver content of 1.5% to 1.8%.

Thereafter, the mask layer 903 may be removed.

Then, in step S513, a solder bump may be formed on the surface of the metal barrier layer by a high temperature reflow process to form a copper pillar bump structure as shown in FIG. 3.

Figure 6:
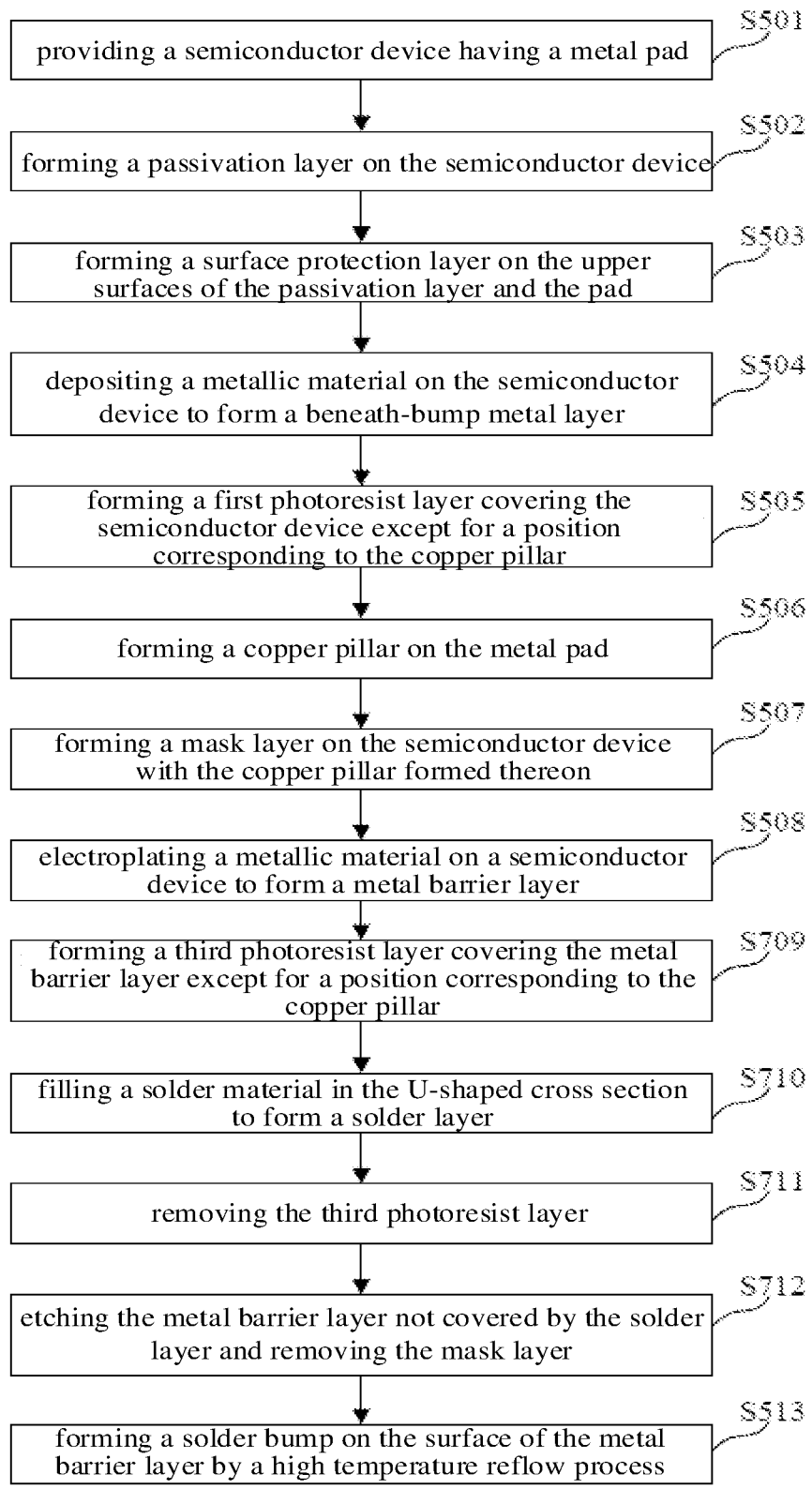
FIG. 6 is a flow chart illustrating a method of fabricating a copper pillar bump structure in accordance with still another embodiment of the present invention.

FIG. 6 is a flow chart illustrating a method of fabricating a copper pillar bump structure in accordance with still another embodiment of the present invention. As shown in FIG. 6, in this method, steps S501, S502, S503, S504, S505, S506, S507, S508 and S513 may be the same as corresponding steps in the fabricating method of the copper pillar bump structure shown in FIG. 5. The fabricating method of the copper pillar bump structure shown in FIG. 6 may further includes the following steps.

Figure 19:
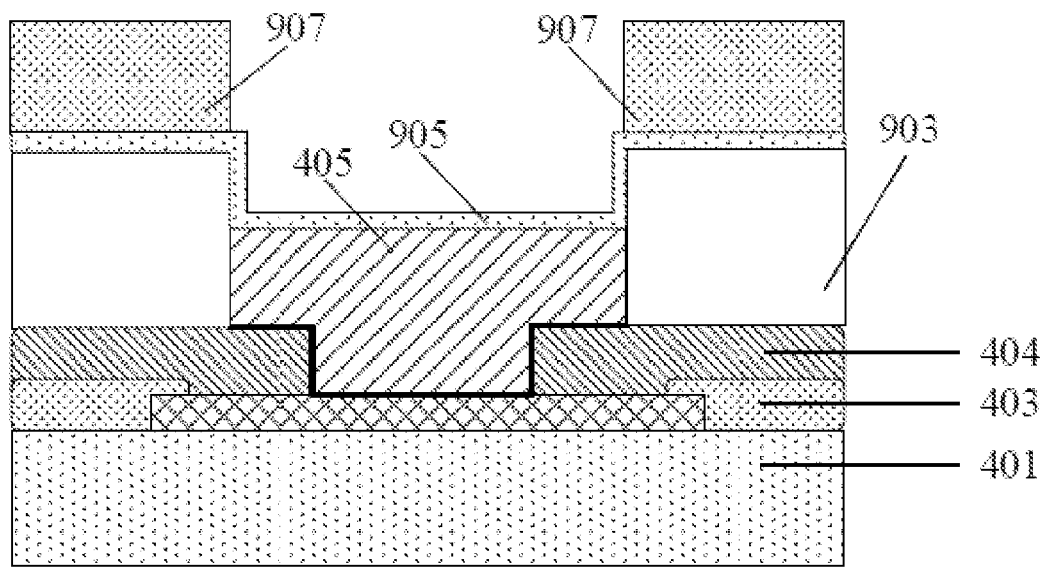
FIG. 19 is a schematic cross-sectional view showing a structure upon the completion of step S709 in accordance with one embodiment of the present invention.

In step S709, a third photoresist layer 907 may be formed covering the metal barrier layer except for a position corresponding to the copper pillar, so that a cross-sectional structure as shown in FIG. 19 may be formed. Same as the first photoresist layer, the third photoresist layer may also be a photoresist layer.

Figure 20:
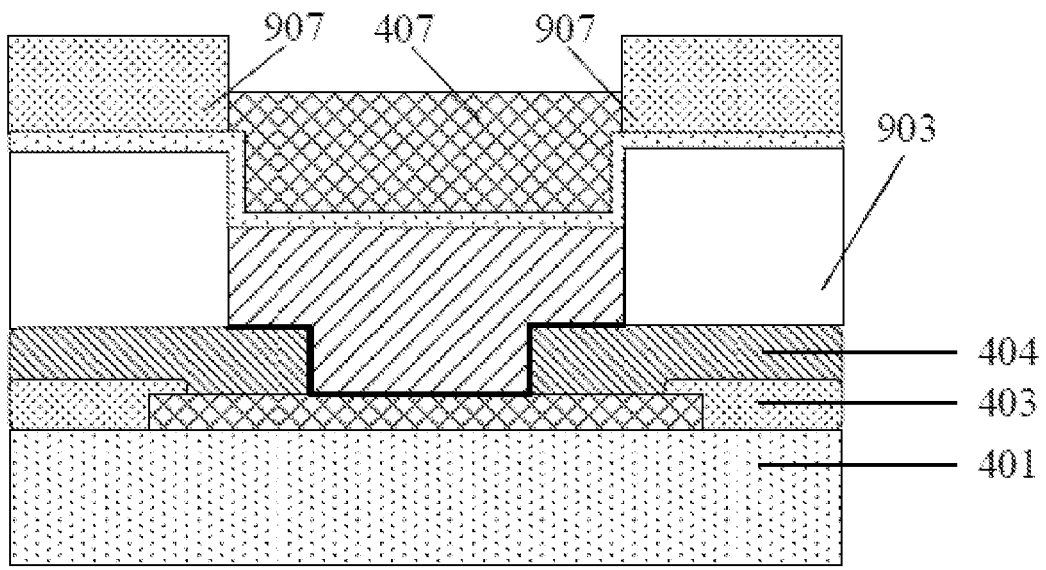
FIG. 20 is a schematic cross-sectional view showing a structure upon the completion of step S710 in accordance with one embodiment of the present invention.

In step S710, a solder layer 407 may be formed by filling a solder material in the U-shaped cross section, so that a cross-sectional structure as shown in FIG. 20 may be formed. The height of the solder layer may be slightly higher than the metal barrier layer and may be lower than the third photoresist layer.

In step S711, the third photoresist layer 907 may be removed.

In step S712, the metal barrier layer not covered by the solder layer may be etched, and then the mask layer may be removed. When the metal barrier layer is etched, the solder layer may be used as a mask. After etching the metal barrier layer that not covered by the solder layer and removing the mask layer, the beneath-bump metal layer not covered by the solder layer may also be etched.

Finally, in step S513, a solder bump may be formed on the surface of the metal barrier layer by a high temperature reflow process to form a copper pillar bump structure as shown in FIG. 3.

In the method for fabricating a copper pillar bump structure provided by an exemplary embodiment of the present invention, by providing a metal barrier layer having a U-shaped cross section and filling a solder layer in the U-shaped cross section, the metal barrier layer may wrap the solder layer. As a result, the non-wetting problem caused by insufficient solder material as a result of climbing tin, or the solder bridging problem caused by excessive solder material, during a flip die soldering process may be remedied.

Other embodiments of the present invention will be apparent to those skilled in the art from considering the specification and practicing the invention disclosed herein. Accordingly, this present invention is intended to cover all and any variations, uses, or adaptations of the present invention which follow, in general, the principles thereof and include such departures from the present invention as come within common knowledge or customary practice within the art to which the invention pertains. It is also intended that the specification and examples be considered as exemplary only, with true scope and spirit of the present invention being indicated by the appended claims.

It is to be understood that the present invention is not limited to the exact structures as described above and illustrated in the figures and may be modified or changed without departing from its scope. The scope of the present invention is intended to be defined only by the appended claims.

The invention claimed is:

1. A method of fabricating a copper pillar bump structure, comprising:
   providing a semiconductor device having a metal pad;
   forming a passivation layer having a first opening on the semiconductor device, the passivation layer covering a peripheral edge of the metal pad, wherein the first opening is aligned with the metal pad and has a size smaller than the metal pad;
   forming a surface protection layer on the passivation layer and on an upper surface of the metal pad;
   forming, by a photolithography process, a second opening having a size smaller than the first opening on the surface protection layer at a position for the copper pillar;
   forming a copper pillar on the metal pad, the copper pillar having a top surface and a side surface;
   forming a mask layer on the semiconductor device having the copper pillar formed thereon;
   forming, by a photolithography process, a third opening on the mask layer at the position for the copper pillar;
   forming, by electroplating a metallic material on the semiconductor device having the mask layer formed thereon, a metal barrier layer on the copper pillar, the metal barrier layer having a U-shaped cross section, a central portion of the metal barrier layer covering the top surface of the copper pillar, an opening of the U-shaped cross section facing away from the copper pillar, wherein a peripheral portion of the metal barrier layer at a side of the U-shaped cross section is bent to form a wall extending from the central portion of the metal barrier layer and away from the copper pillar to protrude from the top surface;

forming a first photoresist layer on the metal barrier layer at a position corresponding to the copper pillar;

etching a portion of the metal barrier layer not covered by the first photoresist layer;

removing the first photoresist layer;

filling the U-shaped cross section with a solder material to form a solder layer;

removing the mask layer; and forming, by a high temperature reflow process, a solder bump on a surface of the metal barrier layer, wherein the wall is configured to prevent the solder layer from diffusing to the copper pillar.

2. The method of claim 1, further comprising: before forming the copper pillar on the metal pad, depositing a metallic material on the semiconductor device to form a beneath-bump metal layer.

3. The method of claim 1, further comprising: before forming the copper pillar on the metal pad, forming a second photoresist layer covering the semiconductor device except for a position corresponding to the copper pillar, and wherein the method further comprises: after forming the copper pillar on the metal pad, removing the second photoresist layer.

* * * * *